United States Patent [19]
Monkowski et al.

[11] Patent Number: 5,091,219
[45] Date of Patent: * Feb. 25, 1992

[54] CHEMICAL VAPOR DEPOSITION METHOD

[75] Inventors: Joseph R. Monkowski; Mark A. Logan, both of Carlsbad, Calif.

[73] Assignee: LAM Research Corporation, Fremont, Calif.

[*] Notice: The portion of the term of this patent subsequent to Dec. 11, 2007 has been disclaimed.

[21] Appl. No.: 555,964

[22] Filed: Jul. 20, 1990

Related U.S. Application Data

[63] Continuation of Ser. No. 15,359, Feb. 17, 1987, Pat. No. 4,976,996.

[51] Int. Cl.⁵ .............................................. C23C 16/00
[52] U.S. Cl. ........................ 427/255.5; 427/255.7; 427/248.1; 427/255.1; 427/307; 427/314
[58] Field of Search ............... 427/255.5, 255.7, 248.1, 427/307, 255.1, 314; 118/719, 725, 730; 414/217

[56] References Cited

U.S. PATENT DOCUMENTS 4,800,105 1/1989 Nakayama et al. ................ 427/253

Primary Examiner—Shrive Beck
Assistant Examiner—Roy V. King
Attorney, Agent, or Firm—Townsend and Townsend

[57] ABSTRACT

A CVD process for the deposition of at least one layer of material on a wafer substrate is disclosed, which comprises the steps of: (a) positioning at least one wafer substrate horizontally within a generally circular wafer deposition zone; (b) passing a reactive gas radially through the zone and across the surface of the wafer substrate in a single pass and preventing the recirculation of any reactive gas or gaseous reaction products over any wafer substrate or through any part of the reaction chamber which affects the wafer substrate; (c) heating the wafer substrate to a point at which the desired deposition material will be formed from the reactive gas by reaction on the surface of the heated wafer substrate and will subsequently bond with the surface; and (d) causing the deposition of material on the surface to be substantially uniform by maintaining the radial flow of the gas at a flow rate to produce a predetermined residence time of the gas over each such wafer substrate sufficiently short to prevent significant lateral diffusion or depletion of the gas across the wafer substrate.

30 Claims, 3 Drawing Sheets

CHEMICAL VAPOR DEPOSITION METHOD

This is a continuation of application Ser. No. 07/015,359 filed 2/17/87, now U.S. Pat. No. 4,976,996.

FIELD OF THE INVENTION

The invention herein relates to chemical vapor deposition CVD reactors and methods of depositing materials on solid substrates such as crystalline wafers by CVD.

BACKGROUND OF THE INVENTION

Chemical vapor deposition is a process which has developed in recent years in the semiconductor industry for manufacture of integrated and discrete semiconductor devices. In a typical manufacturing process a large (2-8 in.; 50-200 mm) wafer of silicon, germanium or similar material in extremely pure crystalline form is overlayed sequentially with numerous layers of materials which function as conductors, semiconductors or insulators. Each subsequent layer is ordered and patterned (usually by photolithographic techniques) such that the sequence of layers forms a complex array of electronic circuitry. Each device on a wafer is much smaller (generally on the order of one $cm^2$) than the wafer. Consequently one step near the end of the manufacturing sequence is to cut the wafer along predetermined scribe lines into the many individual devices, which are commonly referred to as "chips." The devices are tested (usually before separation from the wafer) and subsequently wired into electronic devices. Such devices are key components in electronic devices ranging from toys to weapons systems to supercomputers.

All the above is well known and of course greatly simplified. The manufacturing steps of applying the individual layers of materials such as silicon, silicon dioxide, doped glasses and other layer materials are highly complex. Because the chips are so small and their circuitry so complex, almost any slight flaw or irregularity in a layer can disrupt the circuit patterns and render the chip useless. Indeed it is common for a substantial percentage of the chips on a wafer to be found upon testing to be defective for just such reasons.

CVD processes operate on the basis of two surface reaction steps. First, one or more reactive gases from which the compound or element to be deposited will be obtained are passed over the surface of the wafer under reaction conditions at which the wafer surface will catalyze the liberation of the deposit material. (In some cases a reactive gas will be introduced directly into the reactor, while in others it will be formed in situ in the gas phase in the reactor by reaction from other introduced gases.) The liberation reaction at the wafer surface may be a combination reaction in which two gases react to yield the deposit material and usually at least one by-product gas, or it may be a decomposition reaction in which a single reactive gas is decomposed to yield the deposit material and one or more by-product gases. The liberation reaction is followed by a second surface reaction in which the deposit material chemically combines with the surface of the wafer to form an integral bond and build up a layer (or "film") of deposited material. Because gas is continually flowing over the wafer surface, the types of two reactions are usually occurring simultaneously, such that previously liberated deposit material is bonding to the surface in some areas of the wafer while in others the liberation reaction is occurring. In conventional chip manufacture this process is repeated many times, interspersed with layer patterning steps, to build up the multiple layers of circuitry and insulation which are part of the final device. CVD reaction conditions and reactor parameters must be within certain narrow limits if the necessary surface reaction kinetics are to be maintained and a satisfactory yield of uniform well bonded layers of the deposited materials obtained.

It has been found that numerous problems commonly occur during CVD processes. In many CVD reactors it is difficult or impossible to get uniform gas flow throughout the reactor, so that wafers at different positions within the reactor receive different degrees of deposition. Consequently a batch of wafers from a single reactor run will not have uniform thickness of the deposited layer over all the wafers. Even over the area of a single wafer the flow irregularities can be such that the deposited layer on the wafer is nonuniform. Since the final device properties typically show a large dependence on the thickness and composition of the layers, their uniformity across a wafer and from wafer to wafer is essential.

Further, in many reactors there is substantial turbulence in the gas flow, which can cause the reactive gases to react other than at the surface of the wafers, causing deposited material to be formed in the gas stream and subsequently deposited as irregular particles on wafer surfaces. Such turbulence often involves recirculation of gas streams over wafers which have previously been coated by deposition, again causing problems such as film nonuniformities and contamination of wafer surfaces.

Even in many reactors where the flow of gas is essentially laminar (as defined by Reynolds Number), no provisions have been made to prevent the formation of recirculation cells in the gas phase. Presence of such cells causes the gases to remain in the reaction chamber for uncontrolled amounts of time. Since many reactive gases undergo preliminary reactions to form the appropriate reactive species before contacting the wafer surface, and since the gases continue to undergo these and other reactions as long as they are in the heated chamber, it is important to control the flow of the gas, both before and after it contacts the wafer, if layer uniformity and freedom from contamination are to be maintained. Recirculation makes this control very difficult.

In addition to the operating problems of CVD processes, there are a number of current limitations on CVD which prevents such processes from being readily used for certain types of film deposition. For instance, while it is sometimes possible to deposit metal alloys by CVD on a wafer substrate, this can occur only in those instances where the mixed metal-containing gases react simultaneously to liberate the metal elements under the same reaction conditions.

It has been recognized that CVD is also limited by mass transfer considerations. If sufficient reactive gas can be brought to the surface of a wafer the limiting factor is the kinetics or rate of the surface catalyzed reaction. Since the kinetics increase with temperature, control of the reaction can be obtained by temperature control, and deposition rate can be increased by increasing the temperature. In prior art reactors, however, there is a transition temperature above which the surface catalyzed deposition reaction proceeds so rapidly that the reactants cannot be brought into contact with the surface fast enough, such that mass transfer of the reactants (i.e., delivery of the reactants to the surface) becomes the limiting factor in deposition rate. Mass transfer, however, is far less dependent on temperature than is the surface reaction and therefore increase of temperature beyond the transition temperature results in much less increase in the deposition rate. Since high deposition rates of course mean faster production of chips, the present manufacturing processes are severely limited in output by the mass transfer limitations of the prior art reactors.

Also, conventional prior art reactors (other than the limited-use atmospheric pressure, conveyor belt types) do not permit one to apply more than one type of layer during a single run of the reactor. A layer of a different material can be applied only by thoroughly purging the reactor of the previous reactive gases and then introducing the second reactive gases. Essentially the prior art reactors must be run twice to form two layers.

Existing reactors are typically limited in the types of operations they can carry out, and the ranges of parameters over which they can operate. For example, many are limited to a narrow pressure range, some can operate only at atmospheric pressure, and others can operate only at low pressures (often below 10 torr). Some reactors are limited to plasma-enhanced deposition, relying on a localized plasma over the wafers to provide the energy for the chemical deposition reactions rather than utilizing the thermal energy of the wafers. Typical of these latter reactors is that disclosed in U.S. Pat. No. 3,757,733. In such reactors the gases contact the bottom of the heated wafer support plate before flowing around the plate to contact the wafers. Consequently, if heat alone, rather than a smaller amount of heat in conjunction with plasma assistance (i.e., conventional thermal CVD rather than plasma-assisted CVD) were used for the deposition reactions, there would be extensive deposition of the deposit material on the plate rather than on the wafers, with much of the deposition reaction thus having occurred before the gases even get to the wafers. In addition, in the plasma environment it is well known that electrical damage in the semiconductor device often occurs and that there is also often unwanted incorporation of hydrogen or other species into the film.

Further, many reactors (including that described in the above-mentioned U.S. Pat. No. 3,757,733) are very limited in the source chemicals they can use, and frequently cannot use the highly reactive gas mixtures, since the reactor conditions and parameters are such that the gases react before they reach the wafers or they react more on one part of the wafer than on another. Another typical example of these types of reactors is that described in U.S. Pat. No. 4,430,149, in which wafer uniformity depends on having the wafer move through a uniform environment. Thus unless the depletion rate and composition of the gas remain uniform along the travel path of the wafers through the reactor, there will be nonuniform film deposition. In the situation where two or more components come from two or more gases in the reactant mixture, not only the concentration of the gas but also its composition will vary as a function of position within the reactor, such that the wafers will receive nonuniform film composition as a function of depth through the film layer.

Yet another limitation is in the number of wafers that a reactor can handle at once; in many cases the reactor can handle only one wafer at a time.

The result of these limitations is that individual prior art reactors cannot be used for a wide variety of types of CVD operations, thus substantially increasing the cost to the user who must have several different types of reactors to be able to manufacture different types of films. The user is also often unable to optimize the chemistry and processing conditions within the range of permissible operating conditions for his particular film properties.

It would therefore be advantageous to have a CVD reactor which could rapidly and uniformly deposit a high purity layer on a wafer substrate. It would also be advantageous if such reactor were capable of depositing a plurality of materials on the wafer in a single run, particularly where such individual materials are not otherwise capable of being combined in CVD processing. Finally, it would be advantageous if the reactor were capable of depositing a number of different film types over a wide range of operating conditions with little or no modification from one type of operation to another.

BRIEF SUMMARY OF THE INVENTION

In one aspect the invention herein is a CVD reactor for depositing at least one layer of material onto wafer substrates, which comprises:

a. a generally circular reaction chamber having gas passages into and out of the chamber at the periphery and center therof;

b. a horizontal top surface within the chamber extending substantially across the chamber which can be held at a desired temperature and which in conjunction with a horizontal wafer support plate defines a wafer deposition zone below the top surface;

c. said horizontal wafer support plate for the wafer substrates disposed within the chamber below and spaced apart from the top plate, which can be held at a desired temperature and which in conjunction with the top surface defines the wafer deposition zone above the wafer support plate;

d. means to supply to the wafer deposition zone at least one reactive gas from which the layer of material is to be deposited on the wafer substrate and to exhaust excess gas and gaseous reaction products from the wafer deposition zone;

e. flow control means to cause the reactive gas to pass radially through the wafer deposition zone and over the wafer substrates a single time for a predetermined residence time and to prevent the recirculation of any reactive gas or gaseous reaction product over any wafer substrate or through any part of the reaction chamber which might affect the wafer substrate; and f. heating means to heat the wafer substrates positioned on the wafer support plate.

In a preferred embodiment the wafer support plate is rotatably mounted coaxially with the chamber and the reactor also comprises means to rotate the support plate about the central axis of the chamber.

In yet another preferred embodiment there are additional zones above the top surface and/or below the wafer support plate through which inert gases are passed and which aid in regulating the heating of the wafers.

In another aspect the invention is of a process for the deposition of at least one layer of material on a wafer substrate from a gas, which process comprises:

a. positioning at least one wafer substrate horizontally within a generally circular wafer deposition zone;

b. passing reactive gas radially through the zone and across the surface of the wafer substrate in a single pass and preventing the recirculation of any reactive gas or gaseous reaction product over any wafer substrate or through any part of the reaction chamber which might affect the wafer substrate;

c. heating the wafer substrate to a point at which the desired deposition material will be formed from the reactive gas by reaction on the surface of the heated wafer substrate and will subsequently bond with the surface; and d. causing the deposition of material on the surface to be substantially uniform by maintaining the radial flow of gas at a flow rate to produce a predetermined residence time of gas over each such wafer substrate sufficiently short to prevent significant lateral diffusion or depletion of the gas across the wafer substrate.

In an embodiment of the process, the wafer substrates are rotated about the central axis of the reactor continually or intermittently during the deposition process, to permit the deposition of a plurality of materials or layers onto the wafer substrates without removal of the substrates from the reactor.

In another embodiment of the process, the reactive gas flowing radially enters the generally circular chamber at the periphery thereof and exits at the center thereof; or vice versa.

DETAILED DESCRIPTION AND PREFERRED EMBODIMENTS

Figure 1:
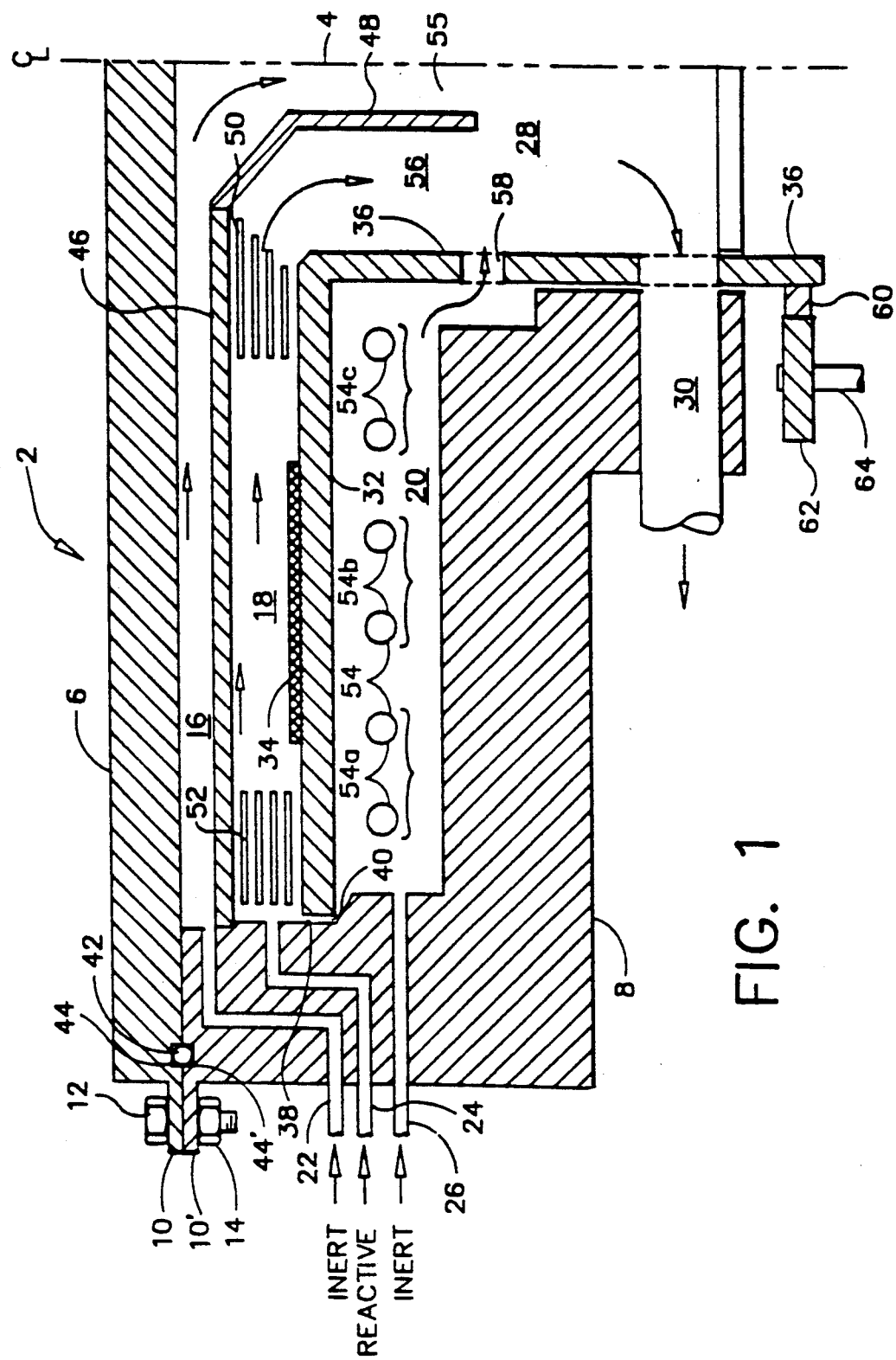
FIG. 1 is a schematic half sectional plan view of the reactor of this invention.
Figure 2:
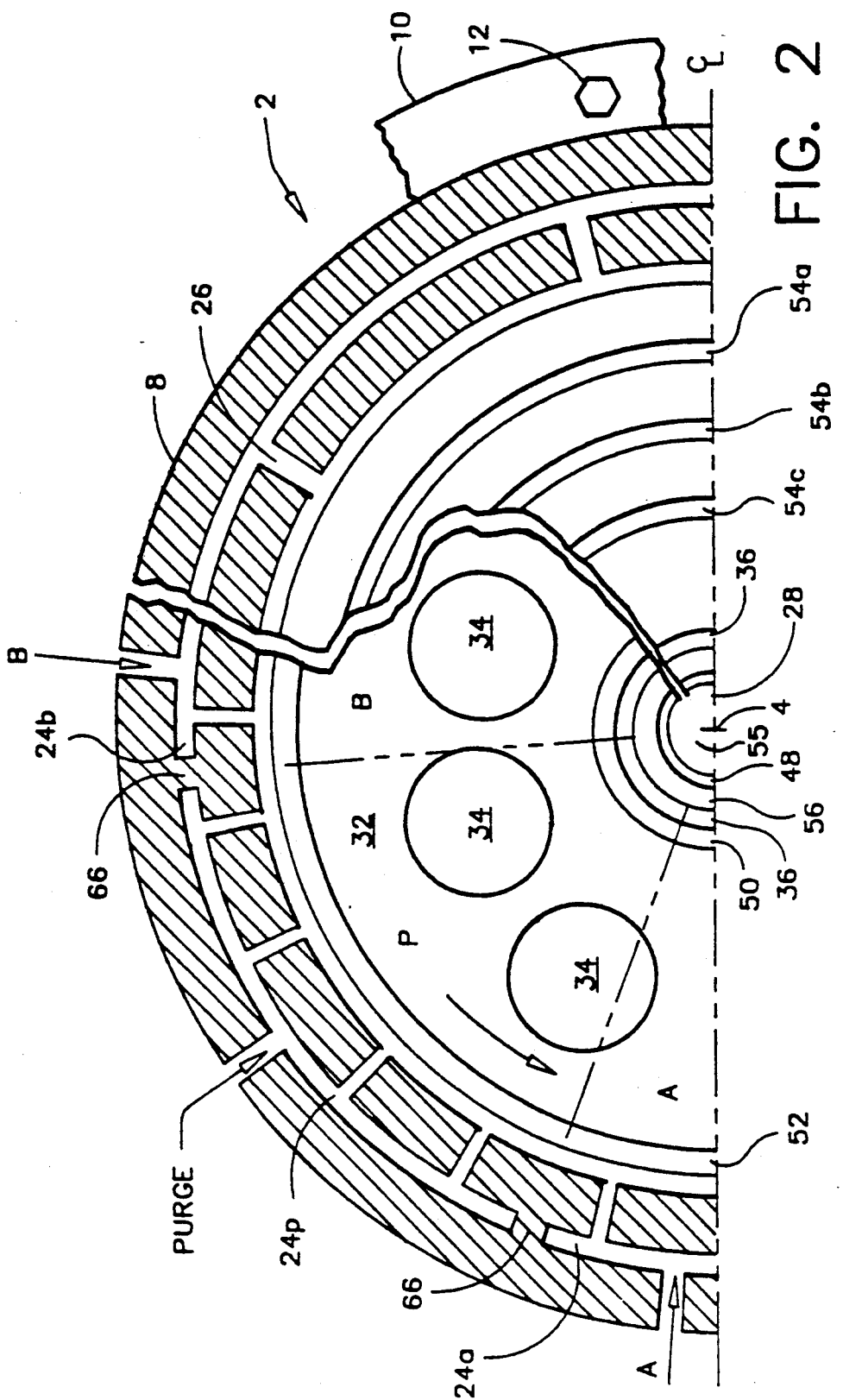
FIG. 2 is a schematic partial sectional plan view of the middle zone and lower zone of the reactor of this invention.

The basic structure of the CVD reactor of this invention is shown in FIGS. 1 and 2. The reactor 2 is cylindrical about its vertical axis 4 and usually substantially wider than it is high. The proportions are not critical; commonly the overall size will be 2-6 ft (60-200 cm) wide and 0.5-2 ft (15-60 cm) high. The reactor has upper housing 6 and a lower housing 8 which are commonly bolted or clamped together when the reactor is in operation by an external ring of bolts or clamps at spaced apart intervals around the periphery of the housings 6 and 8. There are many conventional methods of accomplishing this; typically one can use flange 10 on housing 6 and a corresponding flange 10' on housing 8, secured together by bolts 12 passing through aligned holes in the corresponding flanges and secured by nuts 14.

The hollow interior of the reactor formed by housings 6 and 8 is a reaction chamber which is in the preferred embodiment shown divided into three zones: an upper zone 16, a middle or wafer deposition zone 18 and a lower zone 20, each of which has its own gas supply line 22, 24 and 26, respectively. Centrally located in the reaction chamber is mixing section 28 and exhaust line 30. The reactor will be gas-tight such that it can be evacuated, since the CVD reactions are run over a wide range of pressures in the range of $10^{-7}$ torr to 300 torr (0.5 atm).

Mounted within the reaction chamber is annular wafer support plate plate 32 which is the support upon which the wafer substrates 34 are placed or into which they are recessed such that the top surface of the wafer is in the same plane as the surface of the wafer support plate 32. Wafer support plate 32 extends radially from the center axle 36 outwardly to the inside wall 38 of the reaction chamber formed by housing 8. As will be described below, since wafer support plate 32 is intended to rotate in the preferred embodiments of the reactor, there will be a slight clearance 40 between wall 38 and wafer support plate 32. While a seal could be inserted in space 40 if desired, it is not normally necessary since under typical operating conditions only an insignificant amount of gas diffuses through space 40 between zones 18 and 20. Further, such diffusion as does occur is not harmful to the process, since inert gas (e.g., argon) from zone 20 would diffuse into middle zone 18 with nothing more than a slight diluting effect on the reactive gases. Any reactive gases diffusing out of zone 18 into lower zone 20 will simply be exhausted from the reactor. The amount of reactive gas diffusing will not be such as to materially affect the reaction occurring in middle zone 18.

(It will be understood that gas tight seals at joints will be used wherever necessary, as exemplified by O-ring 42 seated in cooperating grooves 44 and 44' in housings 6 and 8 respectively. For brevity herein not all of the various seals are shown. However those skilled in the art will be well aware of where such seals are necessary or desirable. Any conventional sealing materials which are compatible with the operating temperatures, pressures and gases herein may be used.)

The top of wafer deposition zone 18 is defined by the under surface of top plate 46. It is possible that this top plate could be direct adjacent to the underside of housing 6, separated only by an insulation layer. Preferably, however, upper zone 16 is present and annular top plate 46 is butted at its outward periphery against wall 38 and at its inner periphery against exhaust duct 48.

Disposed at the inner and outer perimeters of wafer support plate 32 are gas flow stabilizer vanes 50 and 52 respectively. These vanes 50 and 52 are a plurality of horizontal annular guides which cause the gas flow to become laminar as it flows through wafer deposition zone 18. Whichever of the two sets of vanes 50 and 52 is at the exit of zone 18 for the gas flow also serves to prevent any recirculation (back flow) of any excess reactive gas, gaseous reaction products and inert carrier gas. In FIG. 1 the gas flow is shown as radially inwardly by the arrows. It will be recognized that gas flow can also be radially outwardly if appropriate modifications are made to the structure at the center of the unit to pass the appropriate gases to the individual zones 16, 18 and 20. This would have the gas supply lines centrally located with the exhaust located at the outer periphery.

It is possible to have heating means built into wafer support plate 32 or otherwise disposed remotely from the wafer deposition zone 18. Preferable, however, lower zone 20 is present and contains radiant heating coils 54 which are aligned concentrically around the reactor. Any convenient number of coils may be used. (The heating coils are shown in lower zone 20, which is the preferred location. If desired, there could also be coils in upper zone 16 operated separately or in unison.)

The ability to maintain wafer support plate 32 and top plate 46 at desired temperatures is important for the accurate heating of the wafers and of the gas, and for prevention of formation of recirculation cells in the chamber. Typically, top plate 46 will be at a temperature about 100°-200° C. (212°-424° F.) less than the temperature of wafer support plate 32. This difference will be large enough to keep the thermally induced deposition on the top plate 46 insignificant in amount compared to deposition on the wafers 34, but will be small enough not to be a driving force for thermal formation of recirculation cells within the gas.

It is possible to operate all coils as a unit. It is preferred however that the coils be divided radially into three groups, designated 54a, 54b and 54c, each of which is individually controllable. It has been found that the greater heat loss occurs at the inner and outer portions of zone 20 so that if all of the coils are operated as a unit there is a temperature maximum near the center of zone 20, which leads to nonuniform heating of the adjacent portion of the wafer support plate 32 and consequently nonuniform heating of the wafers 34. By separating the heating coils into three separate groups the inner and outer groups of coils 54a and 54c can be operated at higher temperatures to account for the extra heat loss so that the resultant temperature imparted to the wafer support plate 32 and wafers 34 is essentially constant from all three groups of coils. The temperatures of operation will be in the range of 100°-900° C. (212°-1652° F.), with the particular temperature chosen for any specific run being an easily determined function of the particular reactants present.

The basic operation of the unit is readily described. Reactive and inert gases from external sources are passed through ducts 22, 24 and 26, respectively, into zones 16, 18 and 20. Heating coils 54 maintain wafer support plate 20 and wafers 34 at the optimum temperature for the surface catalyzed reaction to liberate the depositing material from the reactive gases and subsequently bond the reactant material to the wafer surface. Straightening vanes 50 and 52 create and maintain laminar flow of the reacted gases through the entire zone 18 and exit vanes 50 also prevent any gaseous reactants or reaction products from reentering zone 18 and disrupting the deposition or contaminating the layers. All gases flow in a single pass through zone 18; the presence of vanes 50 and 52 in conjunction with a sufficiently small chamber height (typically 5-20 mm, 0.2-0.8 in.) and temperature difference (typically less than 200° C., 424° F.) between wafer support plate 32 and top plate 46 insure that there is no recirculation, eddying or back flow of any kind. Each wafer thus sees reactive gas passing over only a single time so the radial deposition of the material from the gas is uniform. The gas flow rate is maintained such that optimum residence time of the reactant gas over a wafer is established. Typical linear gas flow rates are in the range of from about 0.1 to about 10 m/sec (0.3-32 ft/sec), with the preferred rates being on the order of 1 m/sec (3 ft/sec). Each wafer thus sees essentially equal quantities of reactant gas as every other wafer and is subjected to surface reaction for deposition for equal residence times, leading to uniform deposited layers for all wafers. This is in marked contrast with the prior art tunnel-type reactors in which those wafers closest to the gas inlet received substantially more reactant material than downstream wafers.

This is a significant improvement over the prior art practice of placing wafers on edge vertically in closely spaced arrays, which required the reactive gases to diffuse down between the wafers, thus leading to significantly greater degrees of deposition at the outer periphery of each wafer than near the center. It is also a marked improvement over those reactors which require the gas to change direction of flow around corners in the reaction chamber itself, leading to nonuniform gas residence times and recirculation.

Deposition rates in the present reactor, as in prior art reactors, will depend on the specific reactions occurring and the material being deposited. If one considers as an example the deposition of $SiO_2$, conventional prior art deposition rates are 150-200 angstroms/minute, with nonuniformities present as approximately 5% of the deposition, as measured by the range of film thicknesses relative to the average thickness. The reactor of this invention can readily achieve a deposition rate of $SiO_2$ of 5000 angstroms/minute or more with a nonuniformity presence of less than 1%. Similar degrees of improvement will be found in the deposition of other materials.

Certain prior art reactors, such as those illustrated in the aforesaid U.S. Pat. Nos. 3,757,733 and 4,430,149, are said to have either or both radial or laminar flow. However, while both laminar and radial flow are elements of the present invention, they are only part of the inventive concept. For maximum film uniformity and freedom from contamination over the widest range of reaction conditions of gas pressure, gas chemistry, gas velocity and wafer temperature, it is necessary to maintain a one-pass flow of the gas with well controlled residence time over the wafers and in the reaction chamber and well controlled gas heating. While different prior art reactors will exhibit different structural or operational features which cause them to fail to meet these criteria, a brief description with respect to the reactor of U.S. Pat. No. 3,757,733 will illustrate the advances of the reactors of the present invention. For instance, once the pressure in the prior art reactor is brought to the range of 10-100 torr and the wafer temperature exceeds 400° C. (750° F.), thermal recirculation cells will form, particularly in corners and where the gas flow makes sharp bends; see Houtman et al, "CVD in Stagnation Point Flow," *J. Electrochem. Soc.*, 133, 5, 961 (May, 1986). As the pressure increases further, recirculation occurs over the wafers themselves; see Van de Ven et al, "Gas Phase Depletion and Flow Dynamics in Horizontal MOCVD Reactors," *J. Crystal Growth*, 76, 352 (1986). In the reactors of this invention, however, such reaction conditions are easily obtained since the closely contained and time-controlled onepass laminar gas flow prevents the formation of recirculation cells at any point in the reaction chamber. In addition, the prior art reactor is disclosed to have produced up to 10% nonuniformities; in the present reactor under equivalent conditions the nonuniformity rate is less than 1%. The disclosures of this patent are exemplary of the fact that it has not heretofore been recognized that a high degree of uniformity of material deposition and prevention of contamination of the deposited layer is accomplished by maintaining the gas in a single pass over the wafers with a defined residence time and with the prevention of any recirculation over any portion of the wafers or into any part of the reaction chamber which could affect the wafers (as, e.g., recirculation into the area just beneath top plate 46, where there could be gas phase reactions forming particles which would fall onto the wafer surfaces). That these optimal conditions can be obtained while forming multi-layer structures in a single reactor run was similarly unrecognized by the prior art.

The gases exiting from zones 16, 18 and 20 pass through passages 55, 56 and 58, respectively, into mixing zone 28 and are exhausted from the unit through conduit 30.

Figure 4:
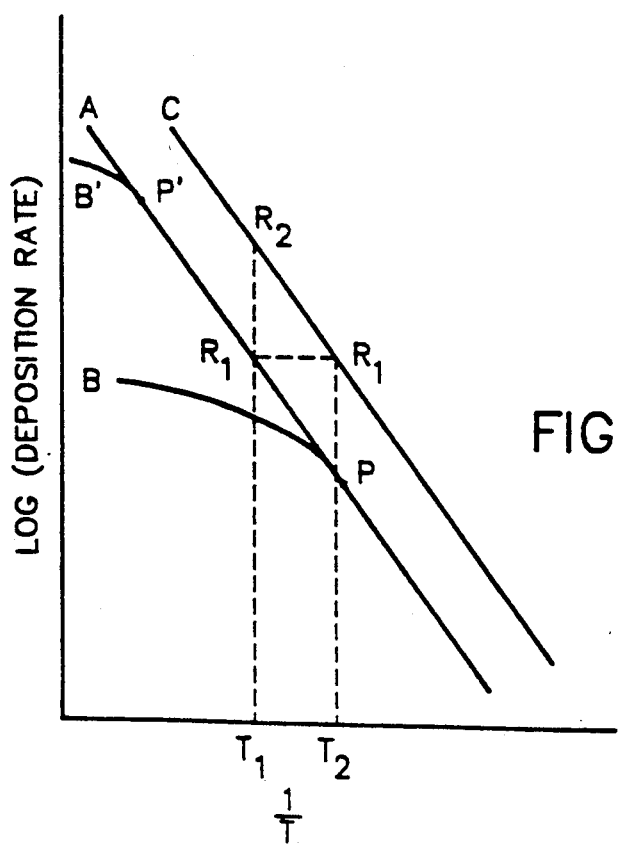
FIG. 4 is a semilogarithmic graph illustrating the reaction kinetics of CVD reactions, including the improved reactions using the reactor of this invention.

The effects of the highly efficient operation of the reactor of this invention are illustrated in FIG. 4, which is a semilogarithmic graph in which the reciprocal of reactor temperature (in °K) is plotted against the logarithm of the rate of deposition of the material to be deposited. Consider a first reaction whose kinetics are illustrated by Line A on the graph. As temperature increases the reaction proceeds more rapidly as long as surface reactions are rate controlling. As noted in the Background above, with prior art reactors the transition temperature point P is rapidly reached where mass transport of the reactants to the surface becomes the limiting function. The deposition rate then diverges along curve B in which the reaction kinetics are not greatly influenced by temperature. The reactor of this invention typically operate so efficiently that the transition point P is significantly raised (as to P') so that mass transfer to the surface is rapid at elevated temperatures and surface reactions remain the rate controlling function over a much wider range of temperatures. Several beneficial effects result from this. The most immediate is that the process operator may operate the reactor over a wider range of temperatures for the first reaction (Line A), thus enabling him to select the optimum temperature $T_1$ and reaction rate $R_1$ for the reaction and reactor conditions, based on the rate of deposition and total amount of deposited material desired. In addition, if one wishes to conduct a second deposition reaction (whose kinetics are indicated by Line C) in the reactor, one can maintain the same reaction temperature $T_1$ and get a higher reaction rate $R_2$ for the second reaction, or the operator can get an equivalent reaction rate $R_1$ at a lower temperature $T_2$, as for example with new chemistries.

The operation described above is the simplest type of operation for which the reactor can be used. However, the reactor is significantly more versatile and is not limited solely to that basic type of CVD reaction.

As mentioned above, the reactor preferably is designed to enable wafer support plate plate 32 to be rotated on central hollow axis 36. The particular type of drive for the rotation is not critical and any conventional drive means which maintains the gas-tight integrity of the unit can be used. For example, the lower end of axle 36 can have external annular gear 60 which meshes with drive pinion 62 which is mounted on motor shaft 64. Shaft 64 is driven by an electric drive motor (not shown). The rotational speed of wafer support plate 32 will be a function of the gas flow rate in zone 18. The rotational speed in the wafer area should be at least approximately one order of magnitude less than the gas flow rate (i.e., on the order of no more than 0.1 m/sec, 0.3 ft/sec) in order to avoid creating shear-imparted turbulence to the reactive gases in the vicinity of the upper surface of wafer support plate 32 and wafers 34. Greater differences in speed may of course also be used.

Figure 3:
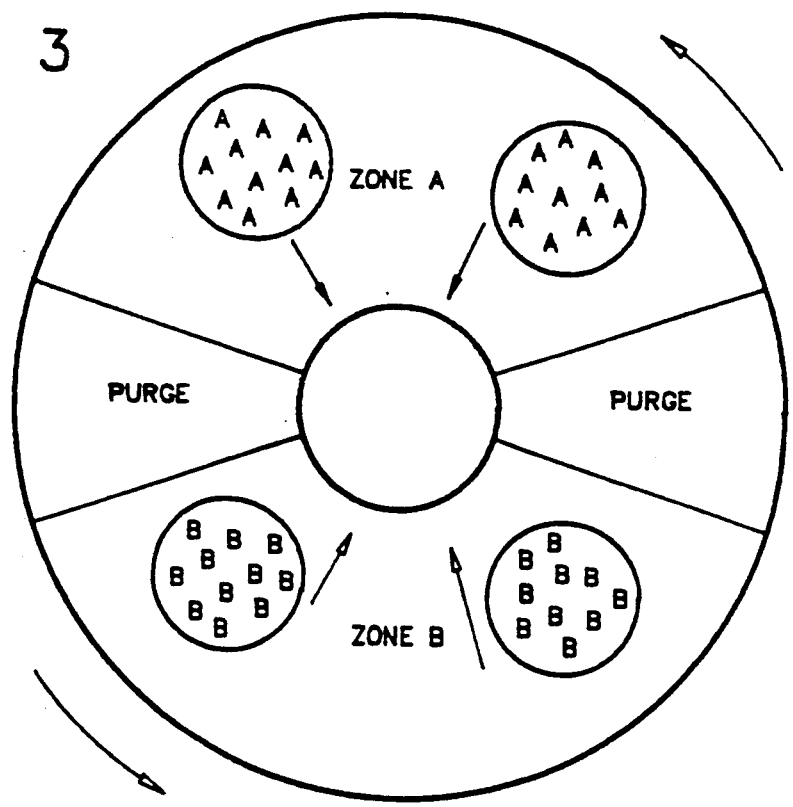
FIG. 3 is a diagrammatic view illustrating the deposition of two separate materials using the reactor of this invention.

The beneficial effects of the rotation are illustrated diagrammatically in FIG. 3. Because the reactive gases flow in a single pass radially through the reaction zone 18 and because laminar flow with no eddying or back flow is maintained, lateral diffusion of the gas streams is very small, commonly on the order of only about 4 cm (1.5 in) at a 1 m/sec (3.3 ft/sec) gas flow. It is therefore possible to introduce a first reactive gas A within only a certain segment of the reactor and as the wafers are slowly rotated through that segment the first material is deposited from the A gas. As the wafers rotate around to a different segment of the reactor a second reactive gas B deposits a second chemical on the wafers. The segments A and B are separated by intermediate zones of inert purging gases so that there is no mixing of the A and B gases at the boundaries of the segments. Means for accomplishing this are shown in FIG. 2 in which the flow channel 24 is shown divided into three segments 24A, 24B and 24P by barriers 66. The A gas flows in zone A, the B gas in zone B and the purge gas in zone P. In the diagram of FIG. 3 the segments are shown as divided with the A and B segments comprising 40% each of the circle of rotation and the two purge zones being 10% each. The actual divisions in any particular system would be dependent on the gas flow rates, the rate of rotation, the degree of lateral diffusion of the A and B gases and the ease with which the A and B gases can be purged in zone P over the wafer support plate 32 and wafers 34 before the next reactive gas zone is reached. It is also possible that one could operate with three (or perhaps even more) gas zones separated by purge zones.

Other benefits also occur because of the rotation of the unit. For instance, if the wafers are all concentrated in one segment of the unit it is possible to flow a first gas over the wafers in that segment until a desired first layer is built up. The unit wafer support plate and wafers can then be rotated into a completely different segment (e.g., 180° opposite) and there subjected to a second reactive gas while the previous segment is being purged with an inert gas. When the purge is completed and the second layer adequately built up the wafer support plate 32 and wafers 34 can be rotated back to the original segment for contact with yet a third gas to build a third layer while the second segment is purged. This of course could be repeated numerous times as desired.

In addition, the rotation allows for the formation of layers, such as doped metal layers, which it has not heretofore been possible to form by CVD. For instance, it is often desirable to put a bimetallic layer (such as aluminum doped with copper) on chips. At present this is usually done by physical techniques such as sputtering each metal from a solid source. CVD is seldom useful because bimetallic sources cannot exist in gaseous form. Therefore one must use separate gases as the sources of the individual metal elements, and CVD is feasible only in those rare situations where the gases all react under the same reaction conditions so that the separate metals deposit simultaneously. With the present reactor, using the two zone technique illustrated in FIG. 3, it is quite feasible to deposit the first metal from a first reactive gas or gases in the A zone under optimum reaction conditions for that reaction and then rotate the wafers to the B zone for deposition of the second from a second reactive gas or gases under the optimum reaction conditions for that reaction. Alternatively, the second metal could be deposited by a non-CVD deposition technique, such as sputtering, evaporation or plasma. A non-CVD deposition technique is particularly important when a source material with an appropriate vapor pressure is not available for the second metal. By setting the rate of rotation at the correct speed to obtain the separate deposition conditions of the two metals, it is possible to create a thin first metal (e.g., aluminum) layer onto which is deposited a second metal (e.g., copper) layer to form a composite bimetallic layer. This may be repeated a number of times until the entire desired bimetallic layer thickness is built up and the layer has a uniform composition. In some instances it is desirable to stop the rotation periodically to allow thicker portions of the layer to build up or to permit metal diffusion or annealing. Further, while the above discussion has been exemplified by a bimetallic layer, it is evident that the same technique can be used to create any polymetallic layer combining two, three or more elements.

The same technique can be used to allow the deposition of materials in sequence from reactive source materials which are incompatible with each other. For instance, in the formation of boron and phosphorus doped glass films, the elements are usually deposited from tetraethylorthosilicate (TEOS), trimethyl phosphite, and trimethyl borate. Under many reaction conditions, however, the borate and phosphite are incompatible. With the present reactor, the borate and phosphite can be reacted different segments of the reactor.

The wafer deposition zone may periodically be cleaned by subjecting the interior to conventional plasma surface cleaning techniques.

Typical wafer support plate diameter is on the order of 2-4 ft (0.6-1.2 m). The reactors can accommodate wafers ranging in size from 2-12 in. (5-30 cm) in diameter, with 2, 3, 4, 5 and 6 in. (5, 7.5, 10, 12.5, and 15 cm) diameters being commonly found in the industry.

While the wafers can be loaded manually by opening the unit under proper ambient environmental conditions, it is preferred to utilize a conventional "load and lock" wafer loading and unloading system. Such units essentially consist of a chamber which can be opened into reaction zone 18 at one end and opened to the outside at the other end. Normally the opening into the reaction zone 18 is kept closed and sealed. Wafers to be coated are placed into the loading chamber and the outer opening closed and sealed. The loading chamber is then purged with inert gas or evacuated (and if desired heated to a predetermined degree). When purging or evacuating and any heating are completed the inner passage is opened and the wafers are loaded into the reaction zone and placed on the wafer support plate 32 in the appropriate locations. Normally this is done with an automatic mechanical loading device contained inside the loading chamber. When the wafers 34 are all loaded into reaction zone 18, the opening to the loading apparatus is again closed and sealed and the deposition process carried out. When deposition of all materials on the wafers is completed, the unloading operation duplicates the loading operation in reverse. By this means, the main reactor and reaction zone 18 are never subjected to contact with the ambient environment. In addition, if desired the reactor can be maintained at a constant temperature and atmosphere by having the loading chamber at those same temperature and atmospheric conditions whenever the inner opening of the loading chamber is opened for loading or unloading of the wafers.

It will be evident that there are numerous embodiments of this invention which are not specifically described above but which are clearly within the scope and spirit of the present invention. The above description is therefore intended to be exemplary only, and the invention is to be limited solely by the appended claims.

We claim:

1. A method for depositing at least one layer of material onto substrates by chemical vapor deposition, comprising
    defining a generally circular reaction chamber about a central axis;
    defining a deposition zone in said reaction chamber between a horizontal top surface extending substantially across said chamber and a horizontal support plate;
    placing at least one substrate on said horizontal support plate;
    holding said horizontal top surface and said horizontal support plate at predetermined temperatures to heat said substrate placed on said support plate;
    supplying said deposition zone with at least one reactive gas from which said layer of material is to be deposited on said substrate and exhausting said reactive gas and gaseous reaction products from said deposition zone at the periphery and center of said reaction chamber; and
    controlling the flow of said gas and gaseous reaction products so that said reactive gas passes radially through said deposition zone and over said substrates in a laminar flow and the recirculation of any reactive gas or gaseous reaction product over said substrate or through any part of said reaction chamber which affects said substrate is prevented; whereby said reactive gas passes over said substrate once for a predetermined residence time.

2. The method as in claim 1 further comprising rotating said support plate about said central axis.

3. The method as in claim 2 wherein said gas flow controlling step comprises placing horizontal straightening vanes between said periphery and said deposition zone, and between said deposition zone and said center.

4. The method as in claim 1 wherein said temperature holding step comprises selecting a predetermined temperature for said top plate such that recirculation cells do not form in said chamber.

5. The method as in claim 2 wherein said gas flow controlling step comprises providing for separate flows of gases to different radial segments of said deposition zone.

6. The method as in claim 5 wherein said gas flow controlling step further comprises preventing said separate flows of gases from any significant mixing with each other while passing through said deposition zone.

7. The method as in claim 6 wherein said gas flow controlling step comprises providing for two separate reactive gases, each at a different radial segment of said deposition zone, and said rotating step rotates said support plate and said substrate between said segments such that two separate materials are deposited sequentially on said substrate.

8. The method as in claim 5 wherein at least one segment of said deposition zone is configured to conduct a nonchemical vapor deposition process.

9. The method as in claim 1 wherein in said gas supplying and exhausting step, said gas is supplied at said periphery and said gas is exhausted at said center of said chamber.

10. The method as in claim 1 wherein in said gas supplying and exhausting step, said gas is supplied at said center and said gas is exhausted at said periphery of said chamber.

11. A method for depositing at least one layer of material by chemical vapor onto substrates, comprising:
defining a circular deposition chamber about a vertical axis with inner and outer peripheries between a horizontal plate for supporting said substrates, said plate having a vertical axis and being symmetric about said vertical axis, and a top surface above and spaced apart from said supporting plate, said top surface extending substantially coextensive with said supporting plate;
introducing a reactive gas into and removing unreacted gas and gaseous reaction products from said deposition chamber at said inner and outer peripheries for radial gas flow with respect to said vertical axis;
heating said substrates on said supporting plate; and
controlling the flow of said reactive gas so that said gas flow through said deposition chamber is laminar and recirculation of reactive gas or gaseous reaction product over said substrates in said deposition chamber is prevented;
whereby said gas flows over said substrates a single time for a predetermined residence time.

12. The method as in claim 11 wherein said gas flow controlling step comprises placing a plurality of horizontal vanes at said inner and outer peripheries of said reaction chamber.

13. The method as in claim 12 wherein said horizontal vane placing step comprises a first set of vanes at said outer periphery and said second set at said inner periphery, each vane being annular and arranged vertically displaced from one another in a stack about said central axis.

14. The method as in claim 13 wherein said gas introducing step is performed at said outer periphery and said gas removing step is performed at said inner periphery.

15. The method as in claim 13 wherein said gas introducing step is performed at said inner periphery and said gas removing step is performed at said outer periphery.

16. The method as in claim 11 wherein said deposition chamber defining step includes displacing said top plate above said support plate by no more than 0.8 inches.

17. The method as in claim 11 wherein said deposition chamber defining step includes displacing said top plate above said support plate by a distance in the range of 0.2 to 0.8 inches.

18. The method as in claim 11 wherein said heating step includes uniformly heating said substrates.

19. The method as in claim 18 wherein heating step includes heating said deposition region of said support plate independently of other parts of said support plate.

20. A method for depositing at least one layer of material onto substrates by chemical vapor deposition, comprising
supplying a gas at a first location for the deposition of material onto said substrates;
exhausting said supplied gas at a second location displaced from said first location;
placing said substrates in a deposition region between said first and second locations, and between a support plate and a top plate displaced above said support plate;
heating said support plate; and
controlling the flow of said gas through said deposition zone and over said substrates in a laminar flow and preventing the recirculation of said gas or gaseous reaction product over said substrates;
whereby said gas passes over said substrates once for a predetermined residence time.

21. The method as in claim 20 wherein said gas flow controlling step is performed by gas flow stabilizer vanes.

22. The method as in claim 21 wherein said gas flow controlling step includes placing said gas flow stabilizer vanes between said first location and said deposition region, and between said deposition region and said second location.

23. The method as in claim 21 wherein said gas flow controlling step includes arranging said gas flow stabilizer vanes in sets, said vanes in a set parallel to each other and to said support plate.

24. The method as in claim 23 wherein said gas flow controlling step includes setting at least some of said vanes with different dimensions in the direction of gas flow.

25. The method as in claim 20 wherein said gas flows through said deposition region at a rate in the rate of approximately 0.1 to 10 meters per second.

26. The method as in claim 25 wherein said gas flows through said deposition region at a rate of approximately 1 meter per second.

27. The method as in claim 20 wherein said gas supplying step, said gas exhausting step, said substrate heating step, said gas flow controlling step are performed in a manner circularly symmetric about a central axis.

28. The method as in claim 27 wherein said gas exhausting step is performed near to said central axis.

29. The method as in claim 28 including the step of rotating said support plate about said central axis.

30. The method as in claim 29 wherein said gas supplying step includes supplying different gases to different radially bounded sections of said deposition region.

* * * * *